United States Patent
Tsividis et al.

(10) Patent No.: US 9,960,457 B2
(45) Date of Patent: May 1, 2018

(54) SYSTEM AND METHOD FOR CELL-SPECIFIC CONTROL OF THREE-TERMINAL CELLS

(71) Applicant: Sendyne Corporation, New York, NY (US)

(72) Inventors: Yannis Tsividis, New York, NY (US); Carl Oppedahl, Westminster, CO (US)

(73) Assignee: Sendyne Corporation, New York, NY (US)

( * ) Notice: Subject to any disclaimer, the term of this patent is extended or adjusted under 35 U.S.C. 154(b) by 0 days. days.

(21) Appl. No.: 15/537,847

(22) PCT Filed: Mar. 17, 2017

(86) PCT No.: PCT/US2017/023097
§ 371 (c)(1),
(2) Date: Jun. 19, 2017

(87) PCT Pub. No.: WO2017/161352
PCT Pub. Date: Sep. 21, 2017

(65) Prior Publication Data
US 2018/0040923 A1    Feb. 8, 2018

Related U.S. Application Data

(60) Provisional application No. 62/309,822, filed on Mar. 17, 2016, provisional application No. 62/442,305, filed on Jan. 4, 2017.

(51) Int. Cl.
*H01M 10/42*  (2006.01)
*H02J 7/00*  (2006.01)
(Continued)

(52) U.S. Cl.
CPC ..... *H01M 10/4264* (2013.01); *H01M 10/486* (2013.01); *H02J 7/0068* (2013.01); *H01M 2010/4271* (2013.01); *H02J 7/345* (2013.01)

(58) Field of Classification Search
CPC ............. H01M 10/4264; H01M 10/486; H02J 7/0068; H02J 7/345
See application file for complete search history.

(56) References Cited

U.S. PATENT DOCUMENTS 3,424,617 A   1/1969  Grieger et al.
3,462,303 A   8/1969  Reber
(Continued)

FOREIGN PATENT DOCUMENTS

EP     2339716 A1    6/2011
JP     2012-135154 A  7/2012

OTHER PUBLICATIONS

International Search Report for PCT/US2017/023097, dated Jun. 19, 2017.
(Continued)

*Primary Examiner* — Oi K Conley
(74) *Attorney, Agent, or Firm* — Oppedahl Patent Law Firm LLC

(57) ABSTRACT

A system and method are described permitting a sophisticated control of a battery composed of a multiplicity of three-terminal electrochemical cells. Each cell has first and second terminals, connected with respective electrodes, one of which is a positive terminal and one of which is a negative terminal. Each cell has a third terminal connected with a grid electrode. A battery is composed of N cells. For each of the N cells, there is provided a respective capacitor switchably coupled to the second and third terminals thereof. A controller is connected through a switching matrix to the capacitors. In operation, the controller is connected sequentially to each capacitor among the multiplicity of capacitors, during which time the capacitor is momentarily uncoupled from its respective cell. When the controller is connected to one of the capacitors, it measures the voltage thereupon. The controller can then charge up or discharge the capacitor to
(Continued)

drive it to a desired voltage level. Thereafter, the capacitor is disconnected from the controller and is coupled again to its respective cell.

5 Claims, 3 Drawing Sheets

(51) Int. Cl.
*H01M 10/48* (2006.01)
*H02J 7/34* (2006.01)

(56) References Cited

U.S. PATENT DOCUMENTS

| | | | | |
|---|---|---|---|---|
| 4,318,430 | A * | 3/1982 | Perman | H01M 4/04 |
| | | | | 141/32 |
| 9,088,053 | B2 | 7/2015 | Suzuki | |
| 2002/0146600 | A1 * | 10/2002 | Vartak | H01M 10/42 |
| | | | | 429/9 |
| 2005/0170245 | A1 | 8/2005 | Vartak et al. | |
| 2009/0104510 | A1 * | 4/2009 | Fulop | H01M 2/30 |
| | | | | 429/50 |
| 2011/0121837 | A1 | 5/2011 | Kim et al. | |

OTHER PUBLICATIONS

Written Opinion of the International Searching Authority for PCT/US2017/023097, dated Jun. 19, 2017.

* cited by examiner

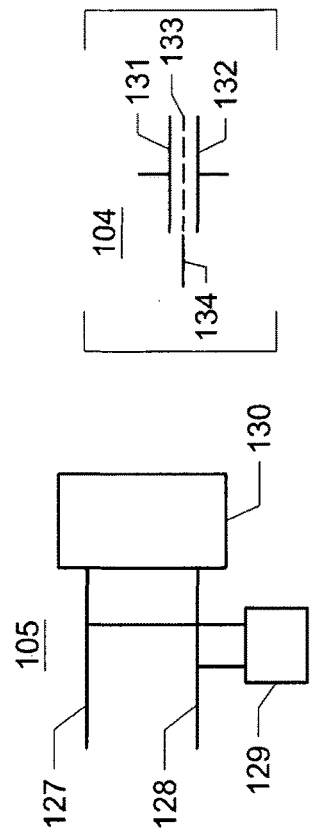
FIG. 4
FIG. 2
FIG. 3
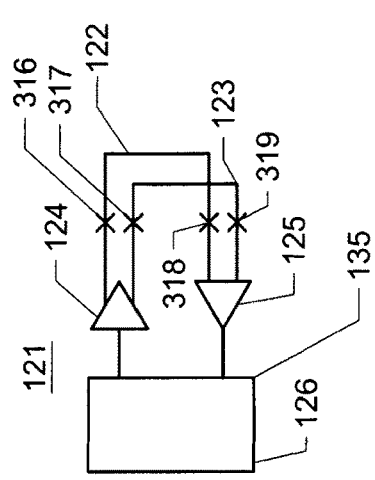
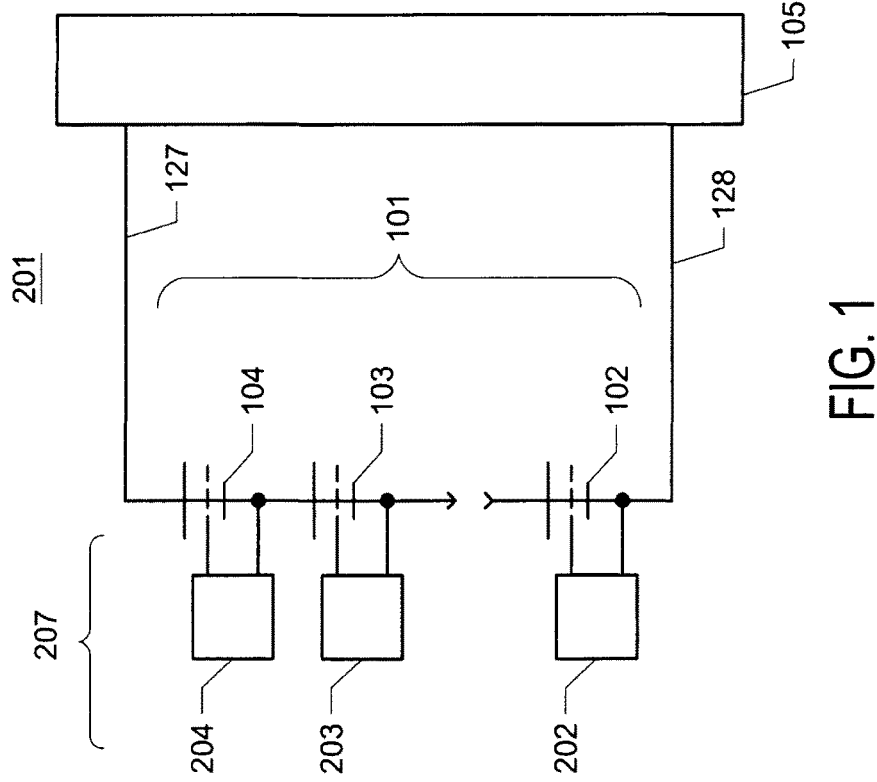
FIG. 1

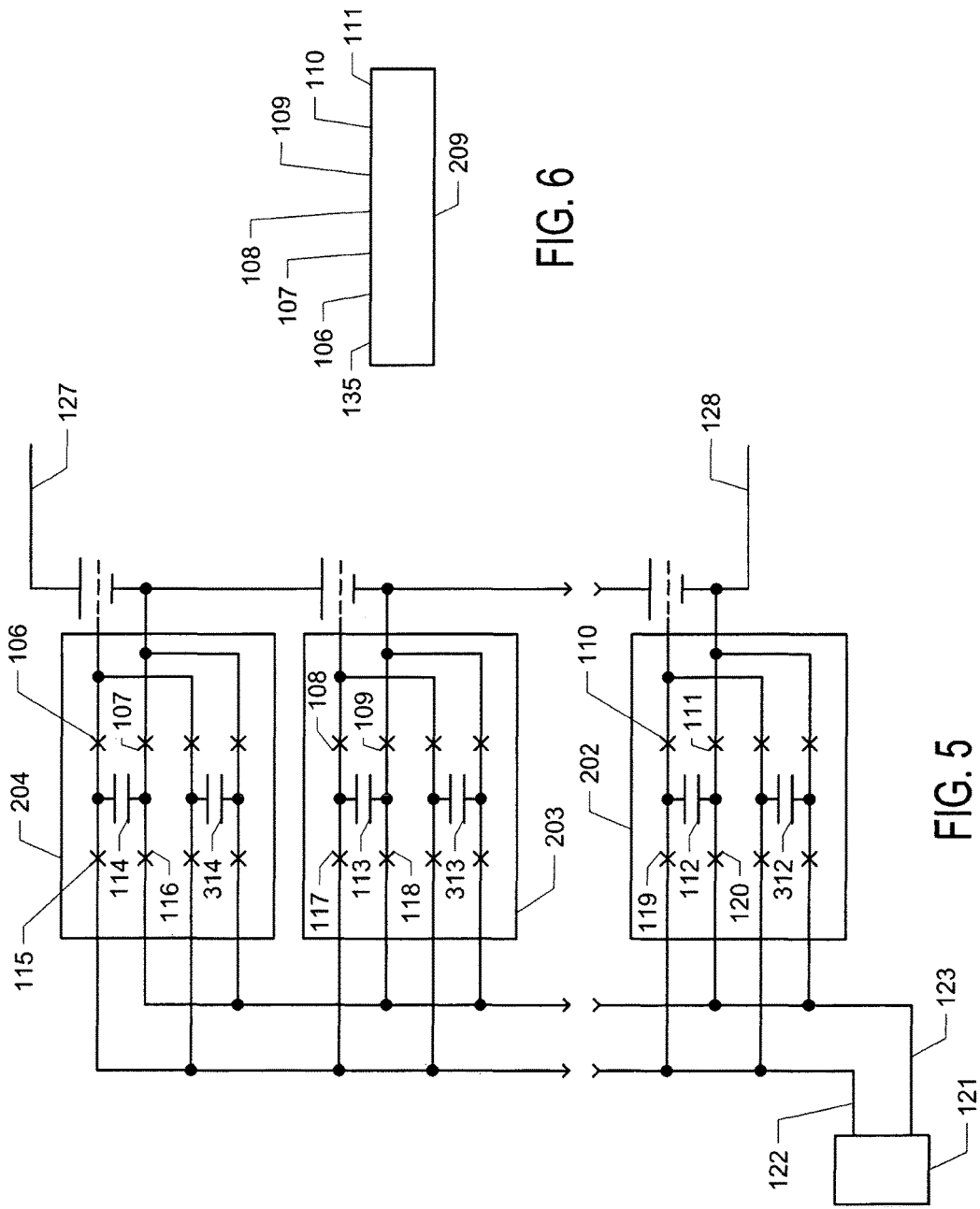

SYSTEM AND METHOD FOR CELL-SPECIFIC CONTROL OF THREE-TERMINAL CELLS

When large amounts of energy are to be stored to and retrieved from a battery composed of three-terminal electrochemical cells, many competing goals need to be satisfied, including but not limited to the following. It is desired to provide a long service life for the battery. It is desired to maximize the energy density of the storage. It is desired to minimize the risk of failure of any particular cell in the battery. It is not easy to satisfy all of these goals simultaneously, and it is not easy to satisfy all of these goals at an acceptable cost. As will be described below, the invention relates generally to control of a battery composed of a multiplicity of three-terminal electrochemical cells, and can also relate to a single three-terminal electrochemical cell.

BACKGROUND

The classical voltaic cell stores electrical energy between two electrodes, and the energy is stored by electrochemical means. Such a cell is sometimes called a "Faradaic" cell to distinguish it from a classical capacitor which stores electrical energy in an electrostatic fashion. The classical cell is a two-terminal device. In most industrial and automotive applications, a multiplicity of voltaic cells are placed in series, defining a battery. In some applications, the cells are placed in series-parallel combinations, defining a battery. The battery is charged and discharged hundreds or thousands of times during its service life. Each cell has two electrodes, typically composed of non-identical metals or other conductive materials, with an electrolyte disposed between the electrodes.

From time to time it has been proposed to place a third electrode in a voltaic cell. It has been proposed that the third electrode might be used for sensing voltage, so as to arrive at an estimate of some parameter of interest in the cell. See for example P. F. Grieger et al., "Sealed battery with charge-control electrode", U.S. Pat. No. 3,424,617 A, Jan. 28, 1969, and H. Reber, "Hermetically sealed storage battery including an auxiliary electrode", U.S. Pat. No. 3,462,303 A, Aug. 19, 1969.

SUMMARY OF THE INVENTION

A system and method are described permitting a sophisticated control of a battery composed of a multiplicity of three-terminal electrochemical cells. Each cell has first and second terminals, connected with respective electrodes, one of which is a positive terminal and one of which is a negative terminal. Each cell has a third terminal connected with a grid electrode. A battery is composed of N cells. For each of the N cells, there is provided a respective capacitor switchably coupled to the second and third terminals thereof. A controller is connected through a switching matrix to the capacitors. In operation, the controller is connected sequentially to each capacitor among the multiplicity of capacitors, during which time the capacitor is momentarily uncoupled from its respective cell. When the controller is connected to one of the capacitors, it measures the voltage thereupon. The controller can then charge up or discharge the capacitor to drive it to a desired voltage level. Thereafter, the capacitor is disconnected from the controller and is coupled again to its respective cell.

DESCRIPTION OF THE DRAWING

The invention will be described with respect to a drawing in several figures, of which:

FIG. 1 shows a system for controlling a battery, including modules for individual control of voltages at grid (third) electrodes of cells, and monitoring thereof;

FIG. 2 shows a driver and sensing system 121 for use in the system of FIG. 1;

FIG. 3 shows a load and charging system 105 forming part of the system of FIG. 1;

FIG. 4 shows an exemplary three-terminal electrochemical cell such as might be used in the system of FIG. 1;

FIG. 5 shows a detail of a second approach for the modules of FIG. 1;

FIG. 6 shows a controller for controlling the modules of FIG. 5; and

Where possible, like reference numerals have been used in the various figures to denote like elements.

DETAILED DESCRIPTION

Figure 7:
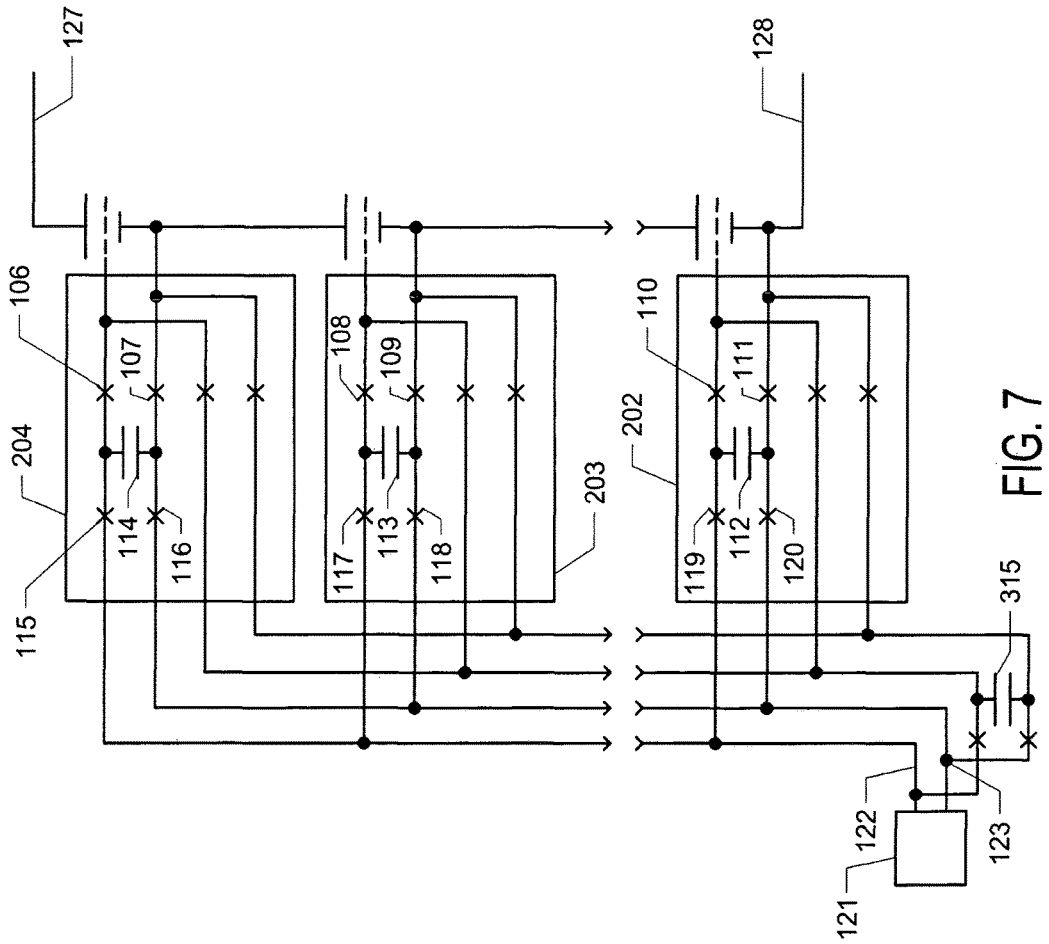
FIG. 7 shows a detail of a third approach for the modules of FIG. 1.

Turning first to FIG. 4, there is shown a three-terminal electrochemical cell. Ignoring for the moment the electrode 133 and the terminal 134, we see a conventional electrochemical cell with positive terminal 131 and negative terminal 132. An electrolyte, omitted for clarity in FIG. 4 is disposed between the positive and negative terminals. A third terminal 134 sets this cell apart from the majority of electrochemical cells which have two terminals. The third terminal 134 connects with a grid 133. The grid 133 lies within the electrolyte and may be compared in some ways with a grid of a triode vacuum tube, and may be compared in some ways with the gate of a field-effect transistor ("FET"). As mentioned above, it has been reported that some investigators have inserted such a grid into an electrochemical cell so as to facilitate the monitoring of electrical potential (voltage) at some point between the positive and negative terminals. In the system according to the invention, it is contemplated that the third terminal 134 and grid 133 are used not only for sensing purposes but also for control purposes, with some electrical potential applied to the grid so as to influence the function of the cell, for example during charging time or during discharging time.

The specific use to which the grid and third electrode will be put in a particular cell are a function of the particular chemistry selected for the cell (for example the composition of the positive and negative electrodes and the selection of electrolyte) and the physical structure (for example electrode surface structure). In one type of cell, the grid voltage might be employed to control (and perhaps to slow down) a charging current to permit an electrode surface to more readily absorb ions in a controlled way. This might be done to attempt to maximize the service life of the cell, or might be done to attempt to maximize the energy storage capacity of the cell.

In general, such an electrochemical cell is not employed in isolation but forms part of a battery (a number of cells in series). In such a battery the grids might be employed to maximize the performance of battery (for example, attempting to maximize service life or energy storage capacity), in which case the grids of the various cells might be driven in more or less the same way. But in such a battery, another possibility is that the grids might be employed as well as part of a cell balancing system. If a particular cell were seen to be out of balance with its neighbors, the grid of that cell might be driven in a particular way, driven rather differently than the grid drive for the neighboring cells.

It will be appreciated that the cell balancing approach described here has an advantage over a traditional cell balancing approach in which resistors are used to draw down particular cells so as to bring about balancing. The resistor approach wastes energy due to heat dissipation in the resistors.

It will be appreciated that in many implementations, the grid 133 is insulated chemically and electrically from the electrolyte of the cell and from the positive and negative electrodes of the cell. If it is insulated, then very little current would ever flow into or out of the cell via terminal 134. The current flow would be the modest amount of current flow needed to bring about some desired potential at the grid.

Another possibility is that the grid 133 is selected to be some material that is nonreactive in the relevant context. Thus for some cell chemistries, the grid might be made of platinum and might not need to be insulated because platinum is nonreactive in the relevant context.

It is also possible the grid 133 might be neither insulated from the electrolyte nor nonreactive relative to the electrolyte.

We turn now to FIG. 1. FIG. 1 shows a battery 101 composed of individual cells such as cell 104 of FIG. 4. The battery 101 is connected via lines 127, 128 with circuitry 105 which in a general way might include a load (such as motors in an electric car) and might include a charging system for recharging the battery 101.

We now turn to FIG. 3. FIG. 3 shows a typical circuitry 105 as in FIG. 1. Circuitry 105 includes a load 130 (for example a motor in an electric car) and a charging system 129 for recharging the battery.

Returning to FIG. 1, we see that each cell 104, 103, 102 in the battery 101 is in series with the other cells of the battery. Each cell has a "third electrode" as discussed in connection with FIG. 4. Each cell has a respective module 204, 203, 202 connected with the grid and another terminal thereof. The modules 204, 203, 202 are collectively termed a battery control apparatus 207. Each of the modules such as module 204 is controlled so as to apply some desired electrical potential (voltage) to the grid and other terminal of the respective cell such as cell 104.

Each module 204, 203, 202 may be an electronic driver, which produces a voltage according to a digital word stored in it, and which is converted to analog form through a D/A converter. As will be discussed below, other approaches may also be employed for the modules 204, 203, 202.

Turning momentarily to FIG. 6, there is shown a controller 209 which controls the modules 204, 203, 202. The controller 209 may receive information about current flowing into the load 130 or information about charging current sourced from the charging system 129. The controller 209 controls the various modules 204, 203, 202 so as to bring about desired potentials at the respective grids of the respective cells. The controller 209 may also collect information from the various modules 204, 203, 202 so as to ascertain the actual potential at the respective grids. In this way the controller 209 may gain information for example about the state of charge of each cell or information about the chemical condition of each cell.

As was mentioned above, each module 204, 203, 202 may be an electronic driver. Turning now to FIG. 5, what is shown is a detail for a second approach for the modules of FIG. 1. Each module 204, 203, 202 has a respective capacitor 112, 113, 114 connected between the grid terminal of its respective cell and between one of the other cell terminals. In FIG. 5 it is portrayed that the capacitor is connected with the grid and with the negative terminal of the cell. It will be appreciated that the capacitor could, without departing from the invention, likewise instead be connected with the grid and with the positive terminal of the cell.

The connection of a capacitor (for example 112) to its respective cell (for example 104) is by means of switches (for example 106, 107). The switches might be traditional electromechanical switches (relays). But more likely the switches will be solid-state switches. Such switches are seen at 106, 107, 108, 109, 110 and 111.

Also provided are switches (for example 115, 116, 117, 118, 119 and 120) that selectively couple one or another of the capacitors 112, 113, 114 with a driver 121 with leads 122, 123 (shown in FIG. 2).

During the time that a particular capacitor (for example 114) is disconnected from its grid, it may be desired to maintain a particular potential at that grid. If so, then as shown in FIG. 5, optionally some additional capacitors 314, 313, 312 may be provided. As for capacitor 114, when it is disconnected from its grid, capacitor 314 may be switched into place to maintain a particular potential at that grid. Just as each capacitor 114 has four switches 106, 107, 115, 116 around it, so that the capacitor 114 may be selectively connected with the grid or with the driver 121, so likewise each capacitor 314 has four switches around it, accomplishing similar selective connection with the grid or with the driver 121. The four switches around capacitor 314 are unlabeled for clarity but their function is apparent to the alert reader from the present discussion.

It will be appreciated that in the arrangement of FIG. 5, the number of switches may be around four times the number of cells if no additional capacitors 314, 313, 312 are provided. If the additional capacitors 314, 313, 312 are provided, then the number of switches may be around eight times the number of cells. But returning to FIG. 1, more generally the individual voltage control on the grids of the cells might use different circuitry than what is shown in FIG. 5. So returning briefly to FIG. 1, the number of switches might be some number other than four times the number of cells. Or the modules 204, 203, 202 might use completely different ways to isolate the grids from each other.

More will be said about the driver 121 in connection with FIG. 2. The driver 121 may have a microcontroller 126 with a control line 135 to the controller 209. The controller 209 may be provided information about the system, such as the temperature of the battery 101, the measured discharge current when the battery 101 powers the load 130, or the measured charging current when the charging system 129 tries to charge up the battery 101. The measurements of current are carried out by means of a current measurement process, the details of which are omitted for clarity in FIG. 1. The measurement of battery temperature is likewise carried out by a temperature sensor at the battery, omitted for clarity in FIG. 1.

Also visible in FIG. 2 is a voltage driver 124 which is intended to be able to force the potential in one of the capacitors 112, 113, 114 to some desired potential. Also visible in FIG. 2 is a sensing amplifier 125. This amplifier 125 provides information of interest to the microcontroller 126, namely the sensed potential on one or another of the capacitors 112, 113, 114.

An exemplary voltage driver 124 may be relatively low impedance when it is trying to drive a capacitor to some desired potential and may be relatively high impedance if it is not trying to drive the capacitor at all. An exemplary amplifier 125 will have a very high input impedance at lines 122, 123 so that it does not disturb the conditions being measured such as the potential on the capacitor such as 112, 113, 114.

Switches 316, 318 may be employed to permit the voltage driver 124 to be selectively connected or not connected with the lines 122, 123. Switches 317, 319 may be employed to permit the amplifier 125 to be selectively connected or not connected with the lines 122, 123.

It will be appreciated that what is shown in FIG. 5 is a switching matrix with four times as many switches as there are cells to control. The switching matrix is controlled with control lines controlled by controller 209. The control lines are omitted for charity in FIGS. 1 and 2.

A typical sequence of steps in connection with FIG. 5 is as follows. First, as a general rule, most of the time each capacitor 112, 113, 114 is connected with its respective cell 104, 103, 102. As mentioned above, each grid 133 may be insulated, in which case the charge on the capacitor may stay substantially unchanged for some period of time. Or as mentioned above, the grid 133 may be a material that is electrically conductive but is not chemically reactive in its context (perhaps platinum), and again this may lead to the charge on the capacitor staying substantially unchanged for some period of time.

With the passage of time, the charge on a capacitor might change, for example due to a substantial running-down of a cell (due to discharge into a load) or due to a substantial charging-up of a cell.

A next step is that cell-side switches (for example 106, 107) are opened so that a selected capacitor (for example 112) is no longer connected with its respective cell (for example 104). After the cell-side switches are opened, then controller-side switches (for example 115, 116) are closed. This connects the selected capacitor with the driver 121.

It is desirable that this switching be break-before-make. This protects the driver 121 from having to deal with the (sometimes very high) voltages present at some points in the battery 101. In an electric car, for example, the battery voltage might be 400 volts or 600 volts. Preserving a break-before-make regime in the switching matrix saves having to "float" the driver 121 and saves having to rate its connections and insulation at such high voltages.

Once the selected capacitor is connected with the driver 121, typically the first step will be to measure the voltage on the capacitor by means of sensing amplifier 125, at a time when the voltage driver 124 has a floating (high impedance) output. If desired, the driver 121 may "touch up" the voltage on the capacitor by means of the voltage driver 124, perhaps drawing down the voltage on the capacitor or charging up the capacitor. It will be noted that the sensing amplifier 125 permits the microcontroller 126 to know what has been accomplished by the voltage driver 124. For example the voltage driver 124 may be "turned on" in a direction that tends to charge or discharge the capacitor, and sensing amplifier 125 may be employed to monitor the voltage on the capacitor, so that the microcontroller 126 can "turn off" the voltage driver 124 when the desired voltage has been reached.

The controller-side switches would then be opened, and after this, the cell-side switches would be closed, reconnecting the capacitor with its respective cell.

Depending upon the detailed goals of the battery control apparatus, it may be intended that the voltage at a particular grid remain constant or nearly constant even during the time that an associated switchable capacitor is disconnected from the grid. There are several approaches that might be followed to make this possible.

One possibility as mentioned above is to double the number of switchable capacitors so that each cell has two respective switchable capacitors, and at any given instant one capacitor or the other is being employed to force the grid to a desired voltage.

Regardless of the details of the battery control apparatus design, the process discussed in connection with FIG. 5 is then repeated for the other capacitors, until all of the capacitors have been checked to see what voltage they contain and each capacitor driven up or down in voltage as desired.

The process is then repeated for all of the capacitors from time to time, so as to learn what voltages are present at the various capacitors and so as to drive the capacitors to desired voltages.

FIG. 7 shows a detail of a third approach for the modules of FIG. 1. Each module 204, 203, 202 has a respective capacitor 112, 113, 114 connected between the grid terminal of its respective cell and between one of the other cell terminals. In FIG. 7 it is portrayed that the capacitor is connected with the grid and with the negative terminal of the cell. It will be appreciated that the capacitor could, without departing from the invention, likewise instead be connected with the grid and with the positive terminal of the cell.

The connection of a capacitor (for example 112) to its respective cell (for example 104) is by means of switches (for example 106, 107). The switches might be traditional electromechanical switches (relays). But more likely the switches will be solid-state switches. Such switches are seen at 106, 107, 108, 109, 110 and 111.

Also provided are switches (for example 115, 116, 117, 118, 119 and 120) that selectively couple one or another of the capacitors 112, 113, 114 with a driver 121 with leads 122, 123 (shown in FIG. 2).

During the time that a particular capacitor (for example 114) is disconnected from its grid, it may be desired to maintain a particular potential at that grid. If so, then as shown in FIG. 7, an additional capacitors 315 may be provided. As for capacitor 114, when it is disconnected from its grid, capacitor 315 may be switched into place to maintain a particular potential at that grid. Just as each capacitor 114 has four switches 106, 107, 115, 116 around it, so that the capacitor 114 may be selectively connected with the grid or with the driver 121, so likewise capacitor 315 has many switches around it, accomplishing similar selective connection with any of the grids of the cells or with the driver 121. The switches around capacitor 315 are unlabeled for clarity but their function is apparent to the alert reader from the present discussion.

It will be appreciated that in the arrangement of FIG. 7, the number of switches may be around six times the number of cells.

The switching matrix of FIG. 7 is controlled with control lines controlled by controller 209. The control lines are omitted for charity in FIG. 7.

A typical sequence of steps in connection with FIG. 7 is as follows. First, as a general rule, most of the time each capacitor 112, 113, 114 is connected with its respective cell 104, 103, 102. As mentioned above, each grid 133 may be insulated, in which case the charge on the capacitor may stay substantially unchanged for some period of time. Or as mentioned above, the grid 133 may be a material that is electrically conductive but is not chemically reactive in its context (perhaps platinum), and again this may lead to the charge on the capacitor staying substantially unchanged for some period of time.

With the passage of time, the charge on a capacitor might change, for example due to a substantial running-down of a cell (due to discharge into a load) or due to a substantial charging-up of a cell.

A next step is that cell-side switches (for example 106, 107) are opened so that a selected capacitor (for example 112) is no longer connected with its respective cell (for example 104). After the cell-side switches are opened, then controller-side switches (for example 115, 116) are closed. This connects the selected capacitor with the driver 121.

The controller-side switches would then be opened, and after this, the cell-side switches would be closed, reconnecting the capacitor with its respective cell.

As shown in FIG. 7, it may be intended that the voltage at a particular grid remain constant or nearly constant even during the time that an associated switchable capacitor is disconnected from the grid.

The capacitor 315 is switched into place at a particular grid during the time that its respective capacitor is uncoupled from the grid.

The process discussed in connection with FIG. 7 is then repeated for the other grids, until all of the capacitor that correspond with a grid have been checked to see what voltage they contain and each capacitor driven up or down in voltage as desired.

The process is then repeated for all of the capacitors from time to time, so as to learn what voltages are present at the various capacitors and so as to drive the capacitors to desired voltages.

In this way, the system may permit cell balancing. If it is learned that some cell is unbalanced relative to its neighbors, the selective tweaking of charge on the capacitor connected with that cell may tend to bring the cell back into balance.

The sensing by means of the grid electrodes may permit the driver 121 and controller 209 to arrive at a prediction of imminent failure of a cell, thus permitting the battery to be taken out of service chronologically prior to such failure.

The system may, in this way, permit more careful control of boundary conditions such as electrode management at extreme times (electrode nearly saturated with ions during charge, or electrode nearly empty of ions during discharge), thus permitting optimization of battery capacity or battery life.

The system and method are shown in a system in which each capacitor is connected with the grid electrode and with the negative electrode of the respective cell. But another approach is that each capacitor is connected with the grid electrode and with the positive electrode of the respective cell. One approach or the other might be optimal depending upon cell chemistry or physical configuration of the cells.

The alert reader will appreciate that other obvious changes and improvements can be made to the system and method without departing therefrom. Any such changes and improvements are intended to be encompassed by the claims which follow.

The invention claimed is:

1. A battery control apparatus for use with a battery composed of a multiplicity of three-terminal electrochemical cells, each cell having first and second terminals, connected with respective electrodes, one of which is a positive terminal and one of which is a negative terminal, and each cell having a third terminal connected with a grid electrode, the apparatus comprising:
for each cell among the multiplicity of cells, a respective module coupled to the second and third terminals thereof; and
a controller;
the controller disposed to control each of the respective modules to bring about a respective desired potential across the respective second and third terminals thereof; and
further comprising the battery composed of the multiplicity of three-terminal electrochemical cells,
wherein each cell contains an electrolyte and the grid of each cell is insulated from the electrolyte.

2. A battery control apparatus for use with a battery composed of a multiplicity of three-terminal electrochemical cells, each cell having first and second terminals, connected with respective electrodes, one of which is a positive terminal and one of which is a negative terminal, and each cell having a third terminal connected with a grid electrode, the apparatus comprising:
for each cell among the multiplicity of cells, a respective module coupled to the second and third terminals thereof; and
a controller;
the controller disposed to control each of the respective modules to bring about a respective desired potential across the respective second and third terminals thereof, and
further comprising the battery composed of the multiplicity of three-terminal electrochemical cells,
wherein each cell contains an electrolyte and the grid of each cell is selected to be some material that is nonreactive in the context of the cell.

3. A method for use with a battery control apparatus for use with a battery composed of a multiplicity of three-terminal electrochemical cells, each cell having first and second terminals, connected with respective electrodes, one of which is a positive terminal and one of which is a negative terminal, and each cell having a third terminal connected with a grid electrode, the battery control apparatus comprising a multiplicity of modules each corresponding to one of the three-terminal electrochemical cells, each module connected with the second and third terminals thereof, the method comprising:
from time to time, controlling each of the modules so as to drive the voltage across the second and third terminals to a respective voltage level;
wherein each of the modules comprises a respective first capacitor and switchable coupling to the second and third terminals of the respective cell, the method further comprising coupling the first capacitor to its respective cell;
from time to time, uncoupling one of the first capacitors from its respective cell and coupling the capacitor with a controller comprising a driver, and driving the voltage thereof to a voltage level;
wherein each of the modules comprises a respective second capacitor and switchable coupling to the second and third terminals of the respective cell, the method further comprising coupling the second capacitor to its respective cell;
from time to time, uncoupling one of the second capacitors from its respective cell and coupling said one of the second capacitors with the controller comprising the driver, and driving the voltage thereof to a voltage level; and
wherein the coupling of the first and second capacitors is carried out so that when the first capacitor is uncoupled from its grid, the second capacitor is coupled thereto, and vice versa.

4. A method for use with a battery control apparatus for use with a battery composed of a multiplicity of three-terminal electrochemical cells, each cell having first and second terminals, connected with respective electrodes, one of which is a positive terminal and one of which is a negative terminal, and each cell having a third terminal connected with a grid electrode, the battery control apparatus comprising a multiplicity of modules each corresponding to one of the three-terminal electrochemical cells, each module connected with the second and third terminals thereof, the method comprising:

from time to time, controlling each of the modules so as to drive the voltage across the second and third terminals to a respective voltage level wherein each of the modules comprises a respective first capacitor and switchable coupling to the second and third terminals of the respective cell, the method further comprising coupling the first capacitor to its respective cell;

from time to time, uncoupling one of the first capacitors from its respective cell and coupling the capacitor with a controller comprising a driver, and driving the voltage thereof to a voltage level;

wherein the apparatus comprises an additional capacitor and switchable coupling to the second and third terminals of each of the cells, the method further comprising coupling the additional capacitor one of the cells; and from time to time, uncoupling the additional capacitor from a cell and coupling the additional capacitor with the controller comprising the driver, and driving the voltage thereof to a voltage level.

5. A method for use with a battery control apparatus for use with a battery composed of a multiplicity of three-terminal electrochemical cells, each cell having first and second terminals, connected with respective electrodes, one of which is a positive terminal and one of which is a negative terminal, and each cell having a third terminal connected with a grid electrode, the battery control apparatus comprising a multiplicity of modules each corresponding to one of the three-terminal electrochemical cells, each module connected with the second and third terminals thereof, the method comprising:

from time to time, controlling each of the modules so as to drive the voltage across the second and third terminals to a respective voltage level wherein each of the modules comprises a respective first capacitor and switchable coupling to the second and third terminals of the respective cell, the method further comprising coupling the first capacitor to its respective cell;

from time to time, uncoupling one of the first capacitors from its respective cell and coupling the capacitor with a controller comprising a driver, and driving the voltage thereof to a voltage level; and further comprising uncoupling the capacitor that is coupled from the controller therefrom, and coupling the capacitor to its respective cell.

\* \* \* \* \*